United States Patent
Cho et al.

(10) Patent No.: US 10,062,616 B2
(45) Date of Patent: Aug. 28, 2018

(54) METHOD OF MANUFACTURING A CMOS TRANSISTOR

(71) Applicant: MagnaChip Semiconductor, Ltd., Cheongju-si (KR)

(72) Inventors: Min Kuck Cho, Cheongju-si (KR); Myeong Seok Kim, Cheongju-si (KR); In Chul Jung, Daeju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/389,501

(22) Filed: Dec. 23, 2016

(65) Prior Publication Data

US 2018/0025948 A1  Jan. 25, 2018

(30) Foreign Application Priority Data

Jul. 22, 2016 (KR) .......................... 10-2016-0093494

(51) Int. Cl.
| | |
|---|---|
| *H01L 21/8238* | (2006.01) |
| *H01L 27/092* | (2006.01) |
| *H01L 21/266* | (2006.01) |
| *H01L 29/66* | (2006.01) |

(52) U.S. Cl.
CPC .... *H01L 21/823814* (2013.01); *H01L 21/266* (2013.01); *H01L 21/823892* (2013.01); *H01L 27/0928* (2013.01); *H01L 29/66492* (2013.01)

(58) Field of Classification Search
None
See application file for complete search history.

(56) References Cited

U.S. PATENT DOCUMENTS

| | | | | |
|---|---|---|---|---|
| 5,792,699 | A | 8/1998 | Tsui | |
| 2002/0187596 | A1* | 12/2002 | Yamanaka | .......... H01L 21/2652 438/197 |
| 2007/0004159 | A1* | 1/2007 | Jin | ...................... H01L 21/2652 438/305 |
| 2008/0233695 | A1 | 9/2008 | Ekbote et al. | |
| 2014/0377919 | A1* | 12/2014 | Mathew | .......... H01L 21/823807 438/231 |

* cited by examiner

*Primary Examiner* — Alexander Ghyka
(74) *Attorney, Agent, or Firm* — NSIP Law

(57) ABSTRACT

A CMOS transistor manufacturing method includes: forming a gate insulating film on a semiconductor substrate; forming a first gate electrode pattern on the gate insulating film in an NMOS transistor area; forming a second gate electrode pattern on the gate insulating film in a PMOS transistor area; forming a first photoresist pattern covering the NMOS transistor area to expose the second gate electrode pattern; performing a first ion injection process into the PMOS transistor area to form an n-type well region and a p-type LDD region; removing the first photoresist pattern; forming a second photoresist pattern covering the PMOS transistor area to expose the first gate electrode pattern; performing a second ion injection process into the NMOS transistor area to form a p-type well region and an n-type LDD region; removing the second photoresist pattern; and forming sidewall spacers at sidewalls of the first and second gate electrode patterns.

12 Claims, 10 Drawing Sheets

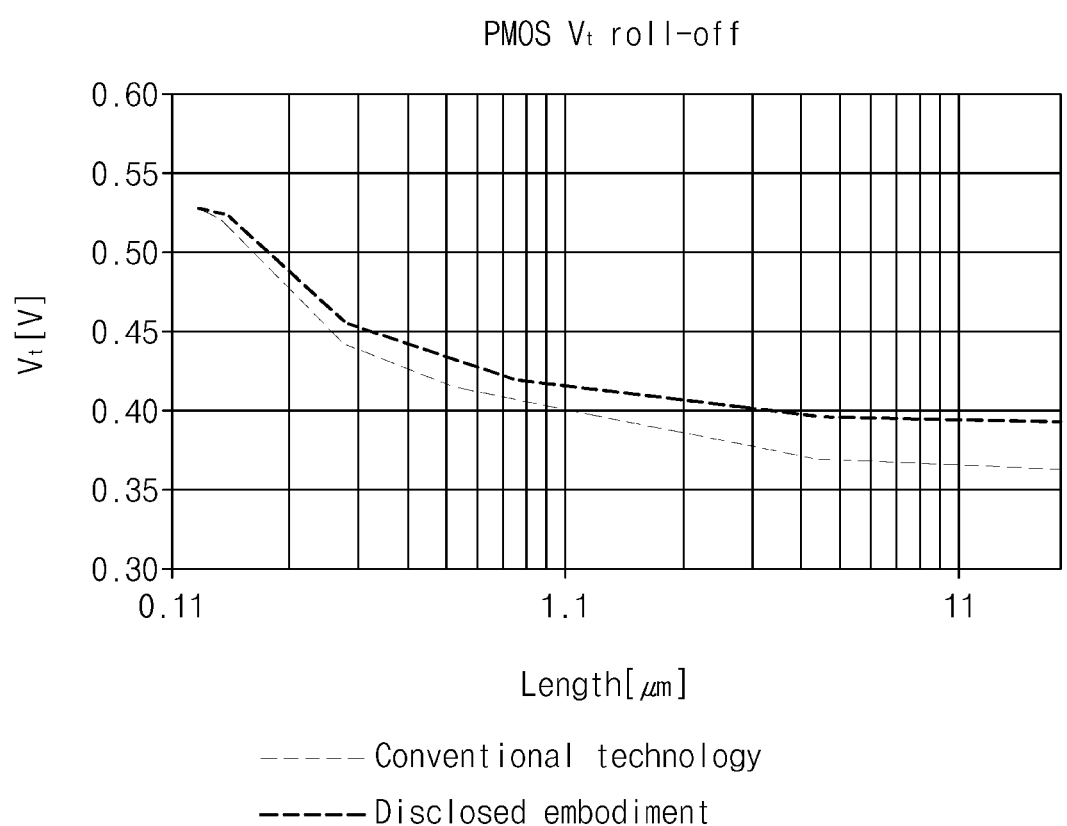

METHOD OF MANUFACTURING A CMOS TRANSISTOR

CROSS-REFERENCE TO RELATED APPLICATIONS

This application claims the benefit under 35 USC 119(a) of Korean Patent Application No. 10-2016-0093494 filed on Jul. 22, 2016 in the Korean Intellectual Property Office, the entire disclosure of which is incorporated herein by reference for all purposes.

BACKGROUND

1. Field

The following description relates to a semiconductor manufacturing process, and more particularly, to a complementary metal-oxide-semiconductor (CMOS) transistor manufacturing process.

2. Description of Related Art

Modern integrated circuit (IC) devices include a large number of complementary metal-oxide-semiconductor (CMOS) transistors that are wired together to form multiple circuits for implementing a variety of functions. A CMOS transistor includes a source region and a drain region formed in a semiconductor substrate, and a gate structure disposed between the source region and the drain region. The gate structure generally includes a gate electrode and a gate insulating film. The gate electrode is disposed on the gate insulating film and controls a flow of charge carriers in a channel region between the drain region and the source region below the gate insulating film to turn the transistor on or off.

The CMOS transistor has a p-type MOS (PMOS) having an excellent power consumption characteristic and an n-type MOS (NMOS) capable of high-speed operation that are arranged symmetrically. The CMOS transistor has the advantage of low power consumption, but on the other hand, it is disadvantageous with respect to degree of integration and manufacturing process. Accordingly, studies for simplifying a CMOS transistor manufacturing process are being conducted in the related industrial technology fields.

It is therefore desirable to provide an improved method of manufacturing a CMOS transistor.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method to manufacture a complementary metal-oxide-semiconductor (CMOS) transistor includes: preparing a semiconductor substrate; forming a gate insulating film on the semiconductor substrate; forming a first gate electrode pattern on the gate insulating film in an n-type metal-oxide-semiconductor (NMOS) transistor area; forming a second gate electrode pattern on the gate insulating film in a p-type metal-oxide-semiconductor (PMOS) transistor; forming a first photoresist pattern covering the NMOS transistor area to expose the second gate electrode pattern in the PMOS transistor area; performing a first ion injection process into the PMOS transistor area to form an n-type well region and a p-type lightly doped drain (LDD) region in the PMOS transistor area, wherein the performing of the first ion injection process includes performing ion injection through the exposed second gate electrode pattern in the PMOS transistor area; removing the first photoresist pattern; forming a second photoresist pattern covering the PMOS transistor area to expose the first gate electrode pattern in the NMOS transistor area; performing a second ion injection process into the NMOS transistor area to form a p-type well region and an n-type LDD region in the NMOS transistor area, wherein the performing of the second ion injection process includes performing ion injection through the exposed first gate electrode pattern in the NMOS transistor area; removing the second photoresist pattern; and forming sidewall spacers at sidewalls of the first and second gate electrode patterns.

The method may further include forming separation films before the forming of the gate insulating film.

The performing of the first ion injection process may further include: performing ion injection such that the n-type well region is formed deeper than the separation films, and such that a depth of the n-type well region below the second gate electrode pattern is shallower than a depth of the n-type well region below the separation films.

The performing of the second ion injection process may further include: performing ion injection such that the p-type well region is formed deeper than the separation films, and such that a depth of the p-type well region below the first gate electrode pattern is shallower than a depth of the p-type well region below the separation films.

The performing of the first ion injection process may further include either one or both of: performing an n-type ion injection process to form an n-type threshold voltage adjustment area below the second gate electrode pattern in the PMOS transistor area; and performing an n-type ion injection process to form an n-type Halo region in the PMOS transistor area.

The performing of the second ion injection process may further include either one or both of: performing a p-type ion injection process to form a p-type threshold voltage adjustment area below the first gate electrode pattern in the NMOS transistor area; and performing a p-type ion injection process to form a p-type Halo region in the NMOS transistor area.

The method may further include: forming a third photoresist pattern covering the PMOS transistor area; and performing a high concentration n-type ion injection process into the NMOS transistor area to form an n-type source region and an n-type drain region.

The method may further include: removing the third photoresist pattern; forming a fourth photoresist pattern covering the NMOS transistor area; and performing a high concentration p-type ion injection process into the PMOS transistor area to form a p-type source region and a p-type drain region.

In another general aspect, a method to manufacture a complementary metal-oxide-semiconductor (CMOS) transistor includes: forming a gate insulating film on a semiconductor substrate; forming a conductive film on the gate insulating film; patterning the conductive film to form a first gate electrode pattern and a second gate electrode pattern; performing a first ion injection process into the semiconductor substrate to form an n-type well region in the semiconductor substrate, wherein the performing of the first ion injection process includes performing ion injection through the second gate electrode pattern; forming a p-type lightly doped drain (LDD) region in the n-type well region; performing a second ion injection process into the semiconductor substrate to form a p-type well region in the semiconductor substrate, wherein the performing of the second ion injection process includes performing ion injection through the first gate electrode pattern; forming an n-type LDD region in the p-type well region; forming sidewall spacers at sidewalls of each of the first and second gate electrode patterns; forming an n-type source region and an n-type drain region in the p-type well region; and forming a p-type source region and a p-type drain region in the n-type well region.

The method may further include forming separation films in the semiconductor substrate before the forming of the gate insulating film.

The performing of the first ion injection process may further include: performing ion injection such that the n-type well region is formed deeper than the separation films, and such that a depth of the n-type well region below the second gate electrode pattern is shallower than a depth of the n-type well region below the separation films.

The performing of the second injection process may further include: performing ion injection such that the p-type well region is formed deeper than the separation films, and such that a depth of the p-type well region below the first gate electrode pattern is shallower than a depth of the p-type well region below the separation films.

The method may further include: forming an n-type threshold voltage adjustment area below the second gate electrode pattern after the performing of the first ion injection process, wherein the forming of the n-type threshold voltage adjustment area includes performing n-type ion injection into the semiconductor substrate through the second gate electrode pattern.

The method may further include: forming a p-type threshold voltage adjustment area below the first gate electrode pattern after the performing of the second ion injection process, wherein the forming of the p-type threshold voltage adjustment area includes performing p-type ion injection into the semiconductor substrate through the first gate electrode pattern.

The performing of the first ion injection process may further include: forming a PMOS threshold voltage adjustment area in an upper portion of the n-type well region, at a surface of the semiconductor substrate below the gate insulating film.

The performing of the second ion injection process may further include: forming an NMOS threshold voltage adjustment area in an upper portion of the p-type well region, at a surface of the semiconductor substrate below the gate insulating film.

In another general aspect, a method to manufacture a complementary metal-oxide-semiconductor (CMOS) transistor includes: forming a gate insulating film on a semiconductor substrate; forming a first gate electrode pattern on the gate insulating film in an n-type metal-oxide-semiconductor (NMOS) transistor area; forming a second gate electrode pattern on the gate insulating film in a p-type metal-oxide-semiconductor (PMOS) transistor area; forming a first photoresist pattern covering the first gate electrode pattern and portions of the semiconductor substrate that are exposed on sides of the first gate electrode pattern; performing a first ion injection process into the PMOS transistor area to form an n-type well region and a p-type lightly doped drain (LDD) region, wherein the performing of the first ion injection process includes performing ion injection through the second gate electrode pattern; removing the first photoresist pattern; forming a second photoresist pattern covering the second gate electrode pattern and portions of the semiconductor substrate exposed on sides of the second gate electrode pattern; performing a second ion injection process into the NMOS transistor area to form a p-type well region and an n-type LDD region, wherein the performing of the second ion injection process includes performing ion injection through the first gate electrode pattern; and removing the second photoresist pattern.

The performing of the first ion injection process may further include: forming an n-type threshold voltage adjustment area in an upper portion of the n-type well region, at a surface of the semiconductor substrate below the gate insulating film.

The performing of the second ion injection process may further include: forming a p-type threshold voltage adjustment area in an upper portion of the p-type well region, at a surface of the semiconductor substrate below the gate insulating film.

The method may further include forming separation films in the semiconductor substrate before the forming of the gate insulating film. The performing of the first ion injection process may further include performing ion injection such that the n-type well region is formed deeper than the separation films, and such that a depth of the n-type well region below the second gate electrode pattern is shallower than a depth of the n-type well region below the separation films. The performing of the second injection process may further include performing ion injection such that the p-type well region is formed deeper than the separation films, and such that a depth of the p-type well region below the first gate electrode pattern is shallower than a depth of the p-type well region below the separation films.

Other features and aspects will be apparent from the following detailed description, the drawings, and the claims.

BRIEF DESCRIPTION OF THE DRAWINGS

FIG. 10 is graph illustrating experimental results of roll-off characteristics of threshold voltages along a longitudinal direction of PMOS transistors in a CMOS transistor formed by a method according to an embodiment, and in a CMOS transistor formed by a conventional method.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
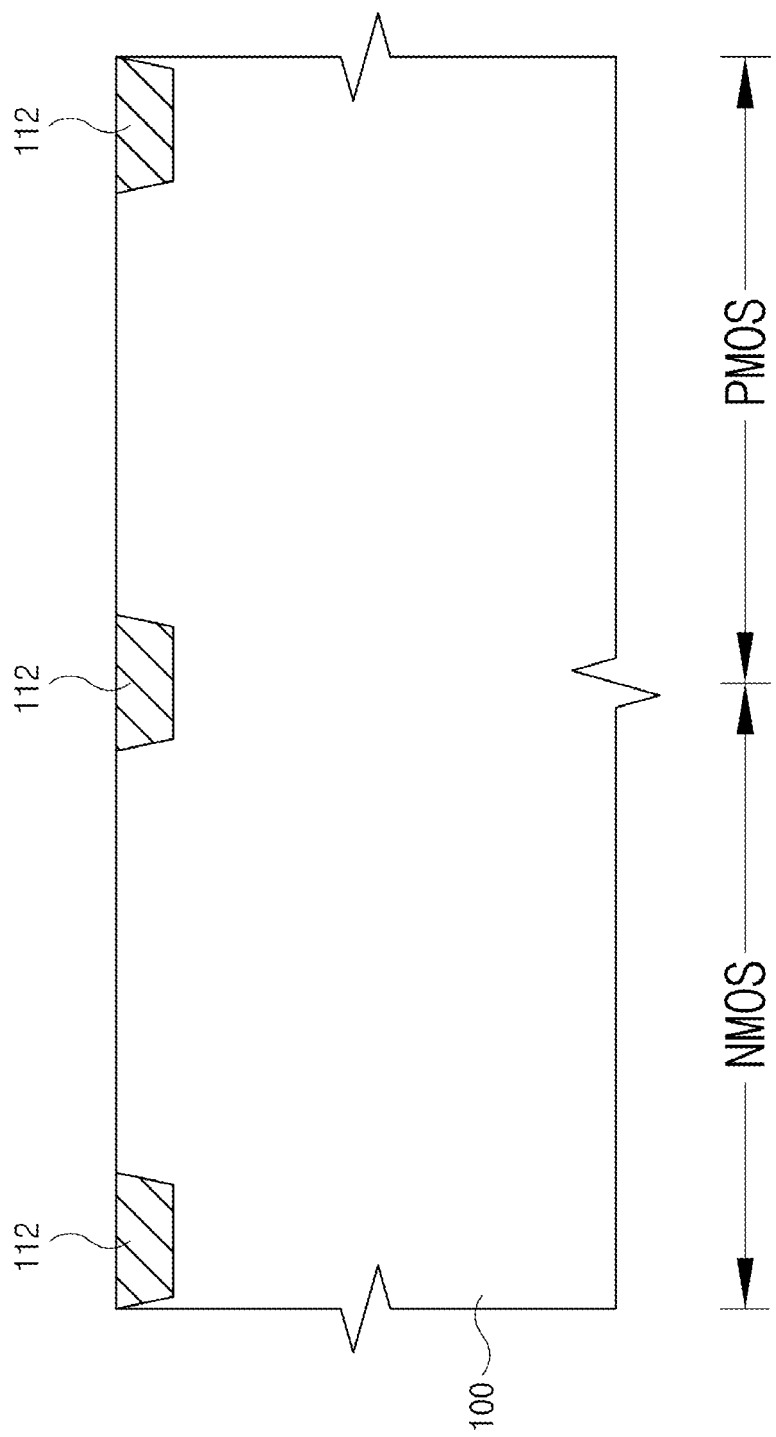
FIG. 1 is a cross-sectional view of a semiconductor substrate in which separation films are formed, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this disclosure, various examples and implementations will be described in detail to provide a method of forming a complementary metal-oxide-semiconductor (CMOS) transistor. Embodiments will be described in more detail below with reference to the appended drawings.

FIGS. 1 to 7 illustrate an embodiment of a method of manufacturing a CMOS transistor. Elements illustrated in the drawings are merely illustrated in sizes relative to those of other elements for convenience, and it should be understood that actual sizes of the elements may be substantially different from those illustrated in the drawings.

FIG. 1 is a cross-sectional view of a semiconductor substrate 100 in which separation films 112 are formed, according to an embodiment. The semiconductor substrate 100 may include substrates formed with materials such as silicon, gallium arsenide (GaAs), and silicon germanium (SiGe), or a silicon-on-insulator (SOI) wafer, an epitaxial layer or other semiconductor layers formed based on those substrates. The separation film 112 serves to separate an n-type metal-oxide-semiconductor (NMOS) transistor area from a p-type metal-oxide-semiconductor (PMOS) transistor area to prevent unnecessary leakage current from flowing therebetween. In an embodiment, the separation film 112 is a shallow trench isolation (STI) including a silicon trench, a trench liner oxide layer, and an oxide layer, but it should be understood that a structure for the separation film 112 is not limited to such an example. For example, the separation film 112 may also be formed using a local oxidation of silicon (LOCOS) process or a deep trench isolation (DTI) process. If the separation film 112 is formed using the STI structure, an etching process, a deposition process such as a high density plasma chemical vapor deposition (HDPCVD) using a silicon oxide film ($SiO_2$), a low pressure chemical vapor deposition (LPCVD), a tetraethyl-orthosilicate (TEOS)

deposition, or a plasma enhanced chemical vapor deposition, a chemical mechanical polishing, and a cleaning process may be used, as is known in the art. It should also be understood that various materials other than the silicon oxide film ($SiO_2$) may be used as a trench filling material for the separation film 112.

Figure 2:
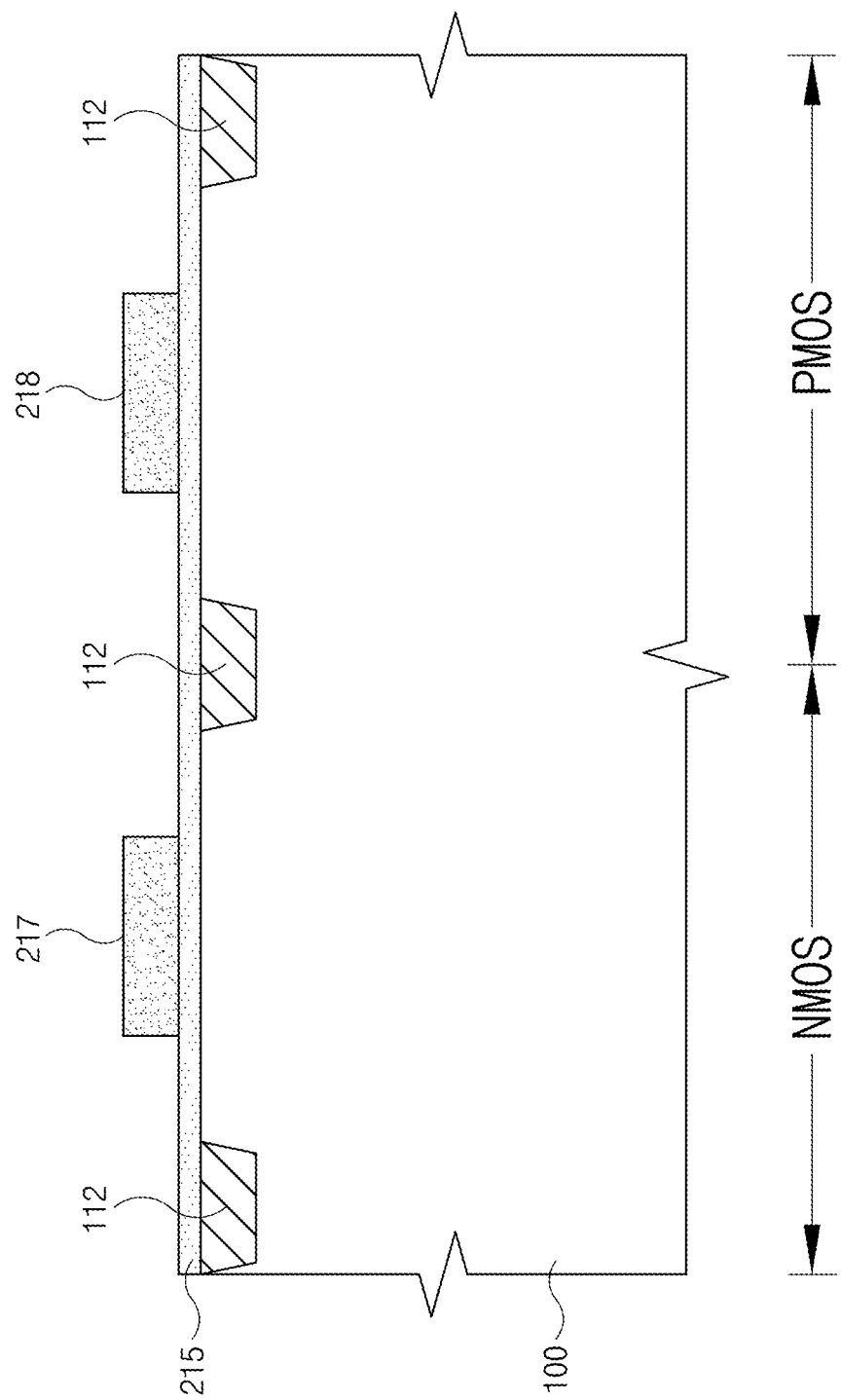
FIG. 2 is a cross-sectional view of a structure including the semiconductor substrate, a gate insulating film laminated on the semiconductor substrate, and gate electrode patterns formed on the gate insulating film, according to an embodiment.

FIG. 2 is a cross-sectional of a structure in which a gate insulating film 215 is laminated on the semiconductor substrate 100, and first and second gate electrode patterns 217 and 218 are formed on the gate insulating film 215. The gate insulating film 215 is formed of a gate dielectric material, such as a silicon oxide film referred to as a "gate oxide film" or a high-k dielectric material, and is formed by an oxidation process, for example. The gate insulating film 215 is formed using a thin gate insulating film for low voltage (LV) or a thick gate insulating film for medium voltage (MV), according to a desired operating voltage of a CMOS transistor. The first and second gate electrode patterns 217 and 218 are respectively formed in the NMOS transistor area and the PMOS transistor area on the gate insulating film 215, as illustrated. The first and second gate electrode patterns 217 and 218 may be formed by laminating a conductive film such as a polysilicon film on the gate insulating film 215 using any one of the deposition processes mentioned above and performing a patterning process such as exposing the laminated conductive film to light and etching the laminated conductive film.

Figure 3:
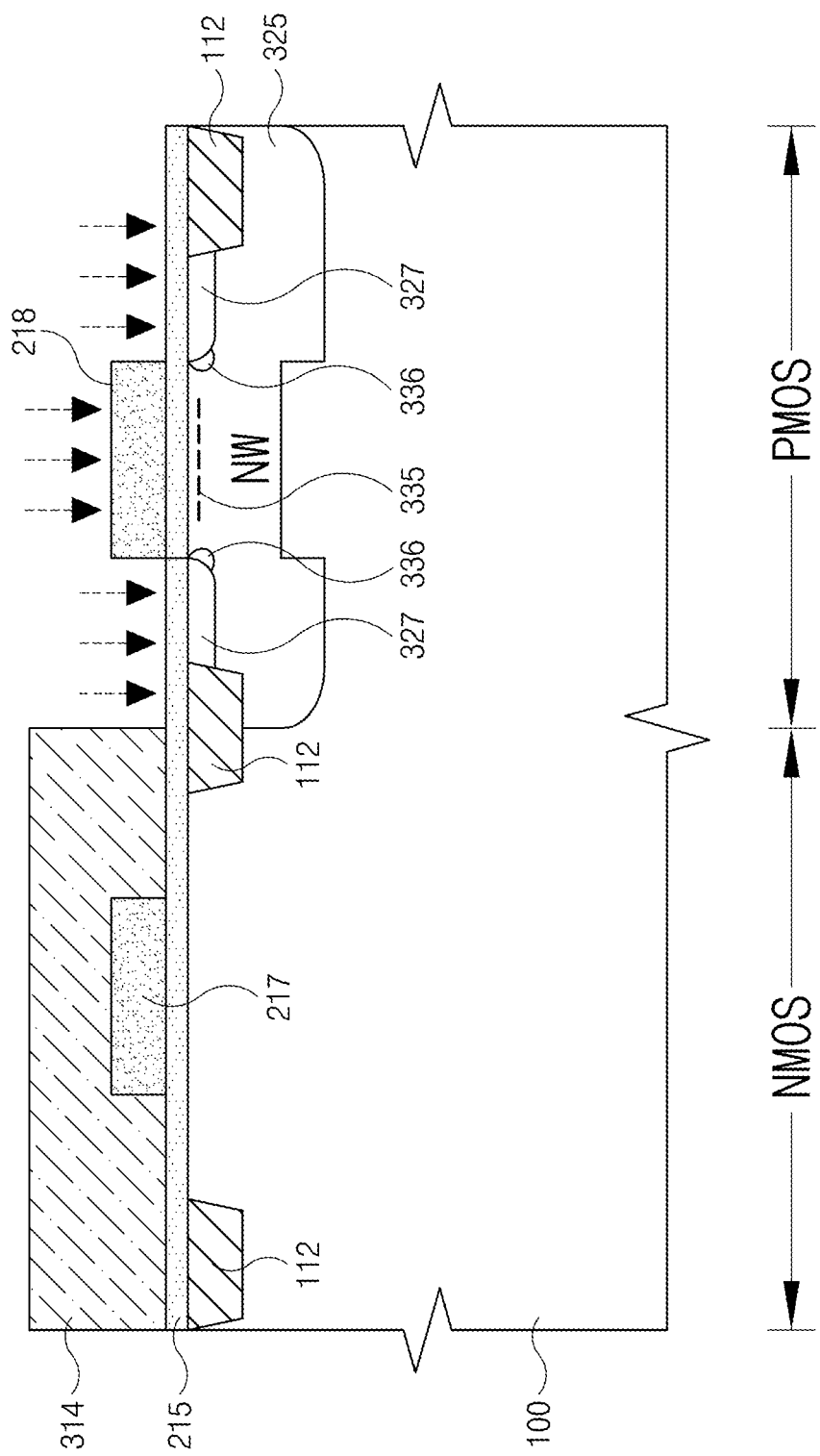
FIG. 3 is a cross-sectional view of a structure in which a first photoresist pattern is formed to cover an n-type metal-oxide-semiconductor (NMOS) transistor area of the semiconductor substrate, and to expose a second gate electrode pattern in a p-type metal-oxide semiconductor (PMOS) transistor area, according to an embodiment.

FIG. 3 is a cross-sectional view in which a first photoresist pattern 314 is formed to cover an n-type metal-oxide-semiconductor (NMOS) transistor area of the semiconductor substrate 100, and to expose the second gate electrode pattern 218 in a p-type metal-oxide semiconductor (PMOS) transistor area. The first photoresist pattern 314 may be formed using a known photolithography process to cover the first gate electrode pattern 217 and the portion of the gate insulating film 215 laminated on the NMOS transistor area. After the first photoresist pattern 314 is formed, an ion injection process is performed into the PMOS transistor area to form an n-type well region 325. The ion injection is performed through the gate insulating film 215 as well as the second gate electrode pattern 218 which is exposed in the PMOS transistor area. As illustrated, the n-type well region 325 (hereinafter, referred to as an "NW region") in the form of a retrograde well is formed deeper than the separation films 112 by high-energy and medium-energy ion injections. In addition, since the ion injection is performed through the exposed second gate electrode pattern 218, a depth of the NW region 325 below the second gate electrode pattern 218 is shallower than a depth of the NW region 325 below the separation films 112. This is because the second gate electrode pattern 218 serves as a mask, and thus the ion injection depth is limited below the second gate electrode pattern 218.

After the ion injection for forming the NW region 325, in an embodiment, an n-type ion injection process is performed to form a PMOS threshold voltage (Vt) adjustment area 335 at an upper portion of the NW region 325. The PMOS threshold voltage (Vt) adjustment area 335 is formed at a surface of the semiconductor substrate 100 below the gate insulating film 215. Since the PMOS threshold voltage adjustment area 335 and the NW region 325 are formed of the same conductivity type, the n-type ion injection process for forming the PMOS threshold voltage adjustment area 335 may be performed immediately after the n-type well ion injection process for forming the NW region 325. In this case, since the ion injection for forming the PMOS threshold voltage adjustment area 335 is performed through the second gate electrode pattern 218, an energy level of ion injection needs to be controlled in consideration of a thickness of the second gate electrode pattern 218. In an embodiment, an energy level of ion injection is set higher than the energy level of ion injection would be set for a case where ion injection is performed in the absence of the second gate electrode pattern 218.

Thereafter, to form PMOS lightly doped drain (LDD) regions 327 (hereinafter, referred to as a "PLDD region"), a p-type LDD ion injection process is performed using p-type dopants. The pair of PLDD regions 327 are formed, for example, in the portions of the semiconductor substrate 100 that are exposed on both sides of the second gate electrode pattern 218. In an embodiment, a tilted ion injection method is implemented using n-type dopants to form an n-type Halo region or pocket region 336 near the PLDD regions 327. Ion injection is carried out into the peripheries of the PLDD regions 327 using the tilt ion injection method. The n-type Halo region 336 is provided to prevent punch-through in the source-drain region. That is, the n-type Halo region 336 is provided to prevent a channel region from disappearing as the depletion regions at the source-drain region gradually extend and merge at their ends.

Figure 4:
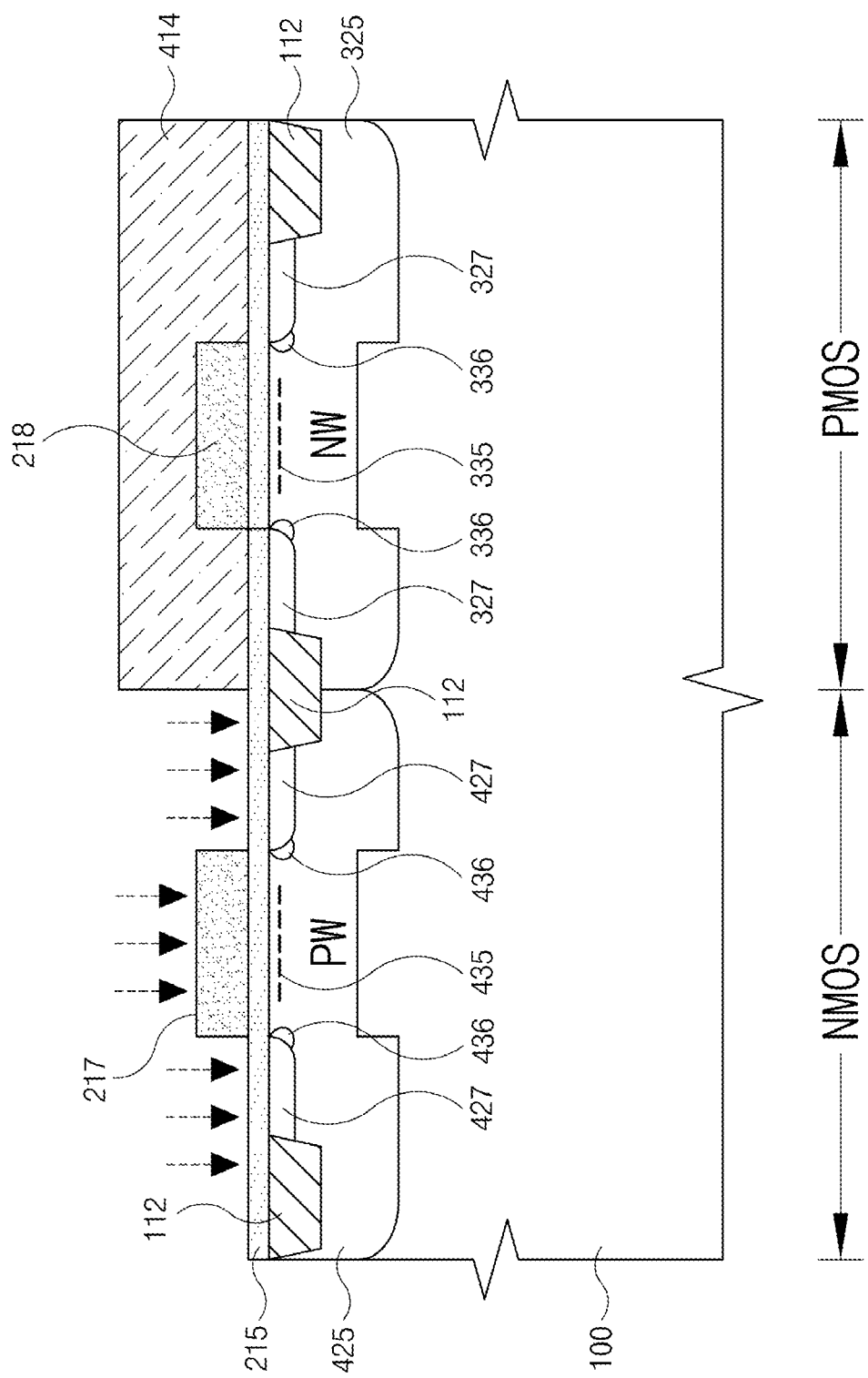
FIG. 4 is a cross-sectional view of a structure in which the first photoresist pattern is removed and a second photoresist pattern is formed to cover the PMOS transistor area of the semiconductor substrate, and to expose the first gate electrode pattern in the NMOS transistor area, according to an embodiment.

FIG. 4 is a cross-sectional view illustrating a structure in which the first photoresist pattern 314 is removed and a second photoresist pattern is formed to cover the PMOS transistor area of the semiconductor substrate 100, and to expose the first gate electrode pattern 217 in the NMOS transistor area. The first photoresist pattern 314 covering the NMOS transistor area is removed, for example, through an ashing and/or cleaning process according to a known method. A procedure of forming a second photoresist pattern 414 in the PMOS transistor area and performing ion injection in the NMOS transistor area is similar to that described above in connection with FIG. 3. The second photoresist pattern 414 is formed, for example, using a known photolithography process to cover the second gate electrode pattern 218 and the portion of the gate insulating film 215 laminated on the PMOS transistor area.

Once the second photoresist pattern 414 is formed, an ion injection process is performed into the NMOS transistor area to form a p-type well region 425 (hereinafter, referred to as a "PW region") in the form of a retrograde well in the NMOS transistor area. As in the case of forming the NW region 325 in the PMOS transistor area, the PW region 425 is formed by high-energy and medium-energy ion injections. The ion injection in this case is also performed through the gate insulating film 215 as well as the first gate electrode pattern 217 which is exposed in the NMOS transistor area. Similarly, the PW region 425 is formed deeper than the separation films 112, but a depth of the PW region 425 below the first gate electrode pattern 217 is shallower than a depth of the PW region 425 below the separation films 112. This is because the ion injection depth is limited by the first gate electrode pattern 217, which serves as a mask.

After the ion injection for forming the PW region 425, a p-type ion injection process is performed to form an NMOS threshold voltage (Vt) adjustment area 435 at an upper portion of the PW region 425. Since the NMOS threshold voltage (Vt) adjustment area 435 and the PW region 425 are formed of the same conductivity type, the p-type ion injection process for forming the NMOS threshold voltage adjustment area 435 may be performed immediately after the p-type well ion injection process for forming the PW region 425. The NMOS threshold voltage adjustment area 435 is formed at a surface of the semiconductor substrate 100 below the gate insulating film 215.

Thereafter, to form a pair of NMOS LDD regions 427 (hereinafter, referred to as an "NLDD regions"), an n-type LDD ion injection process is performed using n-type dopants. The pair of NLDD regions 427 are formed, for example in the portions of the semiconductor substrate 100 that are exposed on both sides of the first gate electrode pattern 217. Since the first gate electrode pattern 217 is exposed at the time of forming the NLDD regions 427, the ion injection may also be performed on the first gate electrode pattern 217. In an embodiment, a tilt ion injection is performed using a p-type dopant to form a p-type Halo region or pocket region 436 near the NLDD regions 427. Ion injection is carried out into the peripheries of the NLDD regions 427 using the tilt ion injection method. As described above, the p-type Halo region 436 is provided to prevent a channel region from disappearing as the depletion regions at the source-drain region gradually extend and merge at their ends.

While it has been described above that after one or more ion injection processes are performed into the PMOS transistor area and one or more ion injection processes are performed into the NMOS transistor area, it should be appreciated that the above description merely provides examples, and the disclosed ion injection processes may be carried out in the reverse order. In addition, while it has been described above that the threshold voltage adjustment areas 335 and 435 are formed first and then the LDD regions 327 and 427 and the Halo regions or pocket regions 336 and 436 are formed thereafter, it should be appreciated that the scope of the disclosure is not to be limited by the above-described order of forming the threshold adjustment areas 335 and 435 and the Halo or pocket regions 336 and 436.

Figure 5:
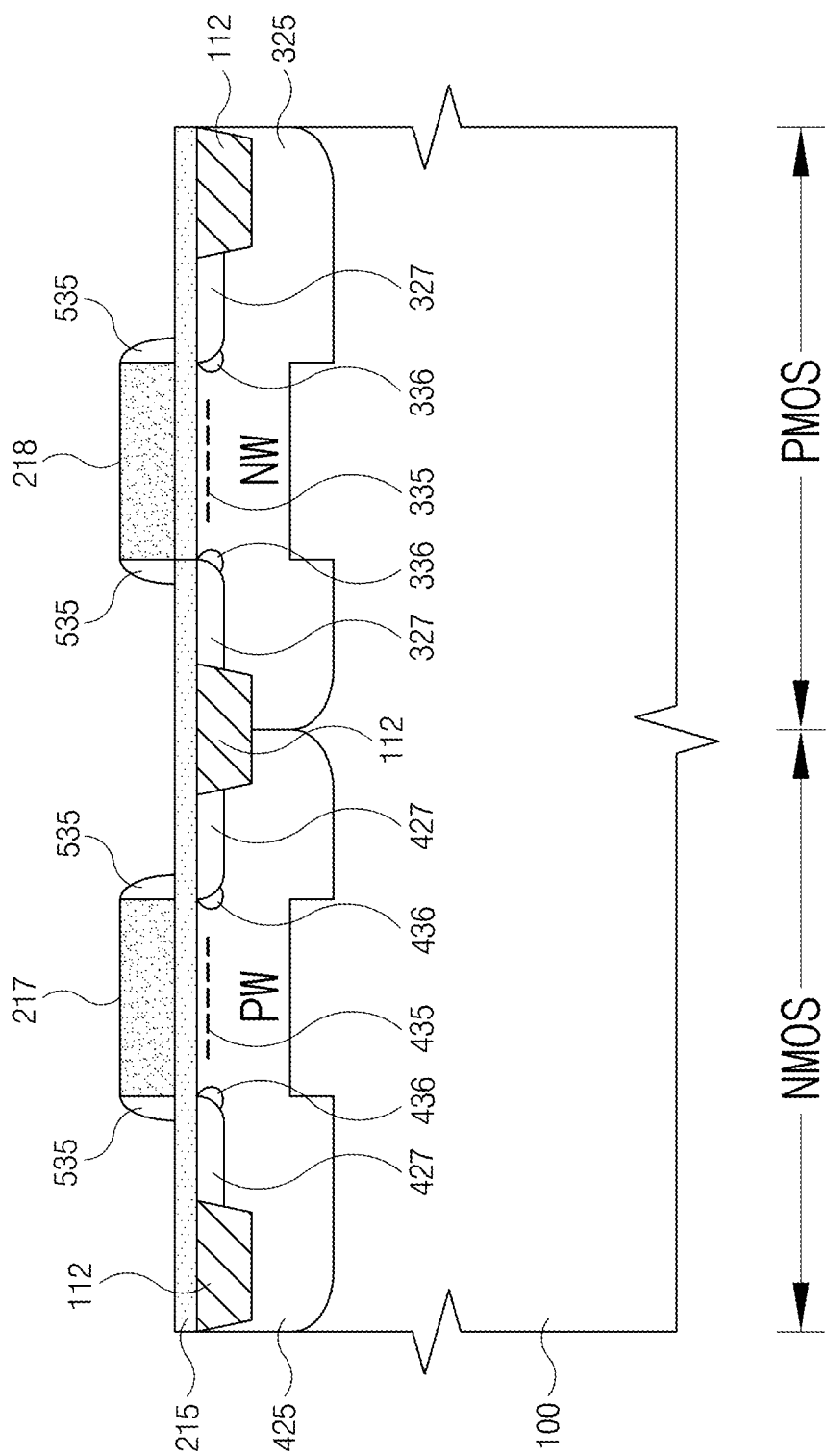
FIG. 5 is a cross-sectional view of a structure in which the second photoresist pattern is removed and sidewall spacers are formed at sidewalls of each of the first and second gate electrode patterns, according to an embodiment.

FIG. 5 is a cross-sectional view of a structure in which the second photoresist pattern 414 is removed and sidewall spacers 535 are formed at sidewalls of each of the first and second gate electrode patterns 217 and 218, according to an embodiment. As is the case with the first photoresist pattern 314, the second photoresist pattern 414 covering the PMOS transistor area is removed, for example, through an ashing and/or cleaning process according to a known method. In an embodiment, after the second photoresist pattern 414 is removed and before sidewall spacers 535 are formed, a rapid thermal annealing process is performed at a high temperature to facilitate diffusion of dopants injected by the ion injection processes described in conjunction with FIGS. 3 and 4. In an embodiment, the sidewall spacers 535 are composed of a dual film formed of a silicon oxide film and a nitride film or a triple film formed of an oxide film, a nitride film and an oxide film, and are formed by an isotropic etch back process.

Figure 6:
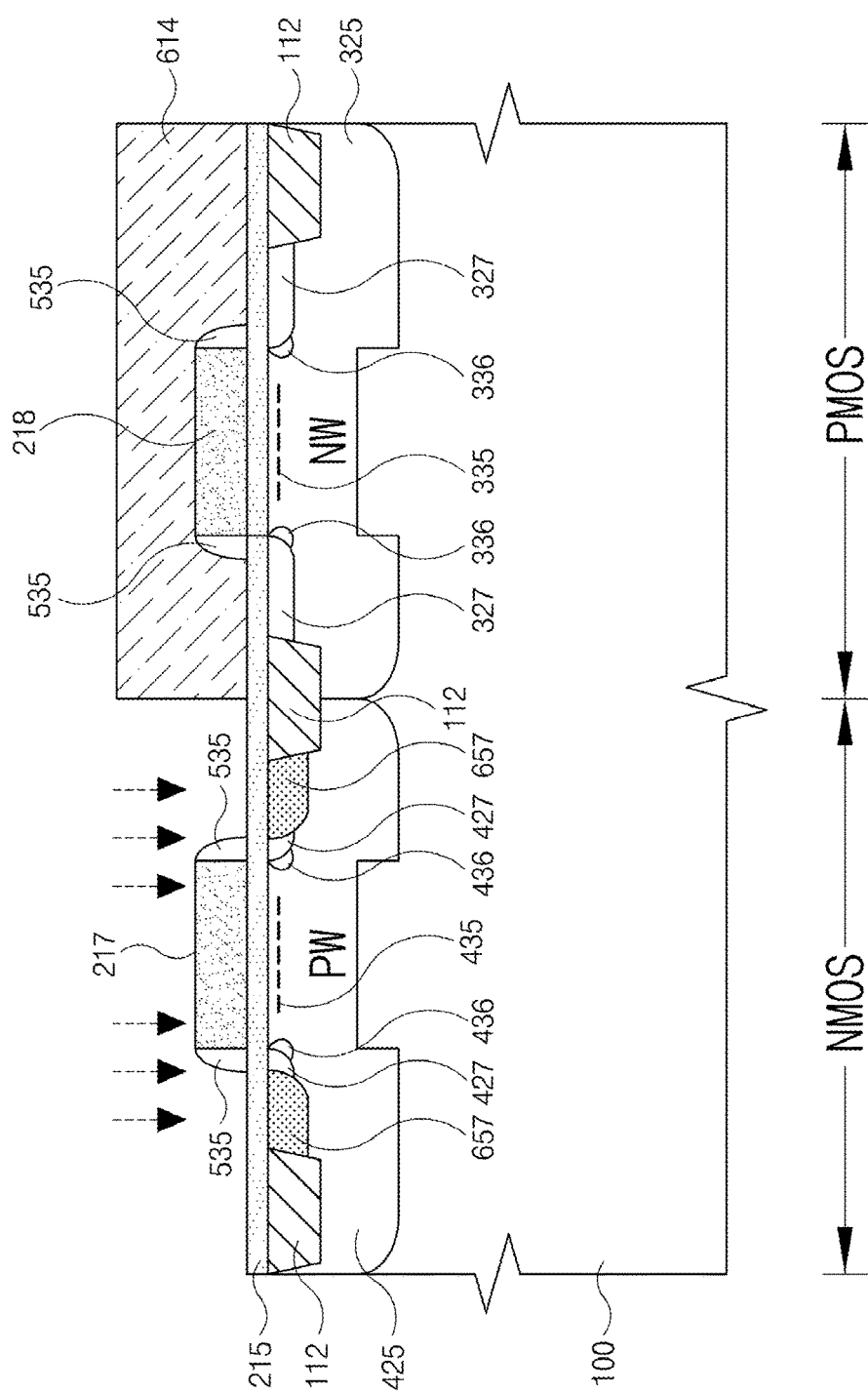
FIG. 6 is a cross-sectional view of a structure in which a third photoresist pattern is formed to cover the PMOS transistor area, according to an embodiment.

FIG. 6 is a cross-sectional view in which a third photoresist pattern 614 is formed to cover the PMOS transistor area, according to an embodiment. The third photoresist pattern 614 is formed, for example, using a known photolithography process to cover the second gate electrode pattern 218 and the portion of the gate insulating film 215 laminated on the PMOS transistor area. Once the third photoresist pattern 614 is formed, a high concentration n-type ion injection process is performed by exploiting the sidewall spacers 535 formed at the side walls of the first gate electrode pattern 217 as masks to form an n-type source region and an n-type drain region 657 (hereinafter, referred to as an "NSD region") below the first gate electrode pattern 217 and the gate insulating film 215 in the NMOS transistor area. In this case, the ion injection may be performed using one or more materials of arsenic and phosphorous.

Figure 7:
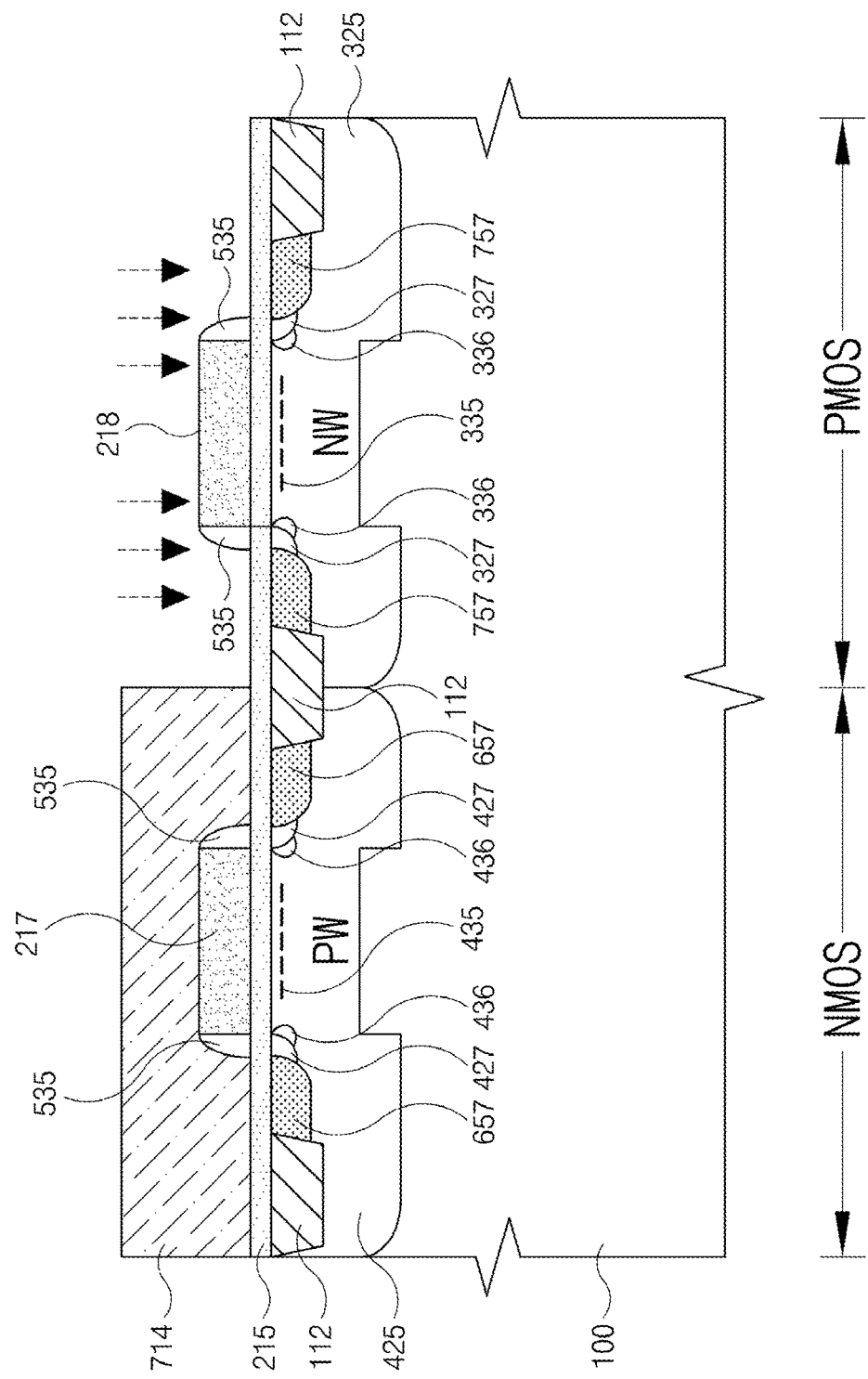
FIG. 7 is a cross-sectional view of a structure in which the third photoresist pattern is removed and a fourth photoresist pattern is formed to cover the PMOS transistor.

FIG. 7 is a cross-sectional view of a structure in which the third photoresist pattern 614 is removed and a fourth photoresist pattern 714 is formed to cover the PMOS transistor area, according to an embodiment. The third photoresist pattern 614 is removed, for example, through an ashing and/or cleaning process according to a known method. The fourth photoresist pattern 714 is formed, for example, using a known photolithography process to cover the first gate electrode pattern 217 and the portion of the gate insulating film 215 laminated on the NMOS transistor area. Once the fourth photoresist pattern 714 is formed, a high concentration p-type ion injection is performed by exploiting the sidewall spacers 535 formed at the side walls of the second gate electrode pattern 218 as masks to form a p-type source region and a p-type drain region 757 (hereinafter, referred to as a "PSD region") below the second gate electrode pattern 218 and the gate insulating film 215 in the PMOS transistor area. In this case, the ion injection may be performed using one or more materials of boron and $BF_2$.

Upon completion of the above-described processes illustrated in FIGS. 1 through 7, a salicide process and back end processing such as forming contacts, metal layers, and pads may be performed to complete the CMOS transistor manufacturing process. In the salicide process, a salicide layer formed of materials such as cobalt (Co), nickel (Ni), and titanium (Ti) is laminated on the surface of the semiconductor substrate 100 and the first and second gate electrode patterns 217 and 218. Gate contact resistance can be reduced if a salicide layer is laminated on a gate electrode pattern. In addition, a thermal process such as a rapid thermal annealing process is performed to activate injected ions in the source and drain regions.

As described above, according to the embodiments disclosed herein, after the first and second gate electrode patterns 217 and 218 are formed, ion injection for forming the well regions 325 and 425 and the LDD regions 327 and 427, channel ion implantation for forming the threshold voltage adjustment areas 335 and 435, and/or ion injection for forming the Halo regions 336 and 436 may be performed using one mask (photoresist pattern) per transistor area. According to the embodiments disclosed above, a total of four masks are used until the ion injection process for forming the source and drain regions 657 and 757 is finished. Furthermore, according to the embodiments disclosed above, the thermal budget can be reduced to thereby improve a reverse short channel effect.

Figure 8:
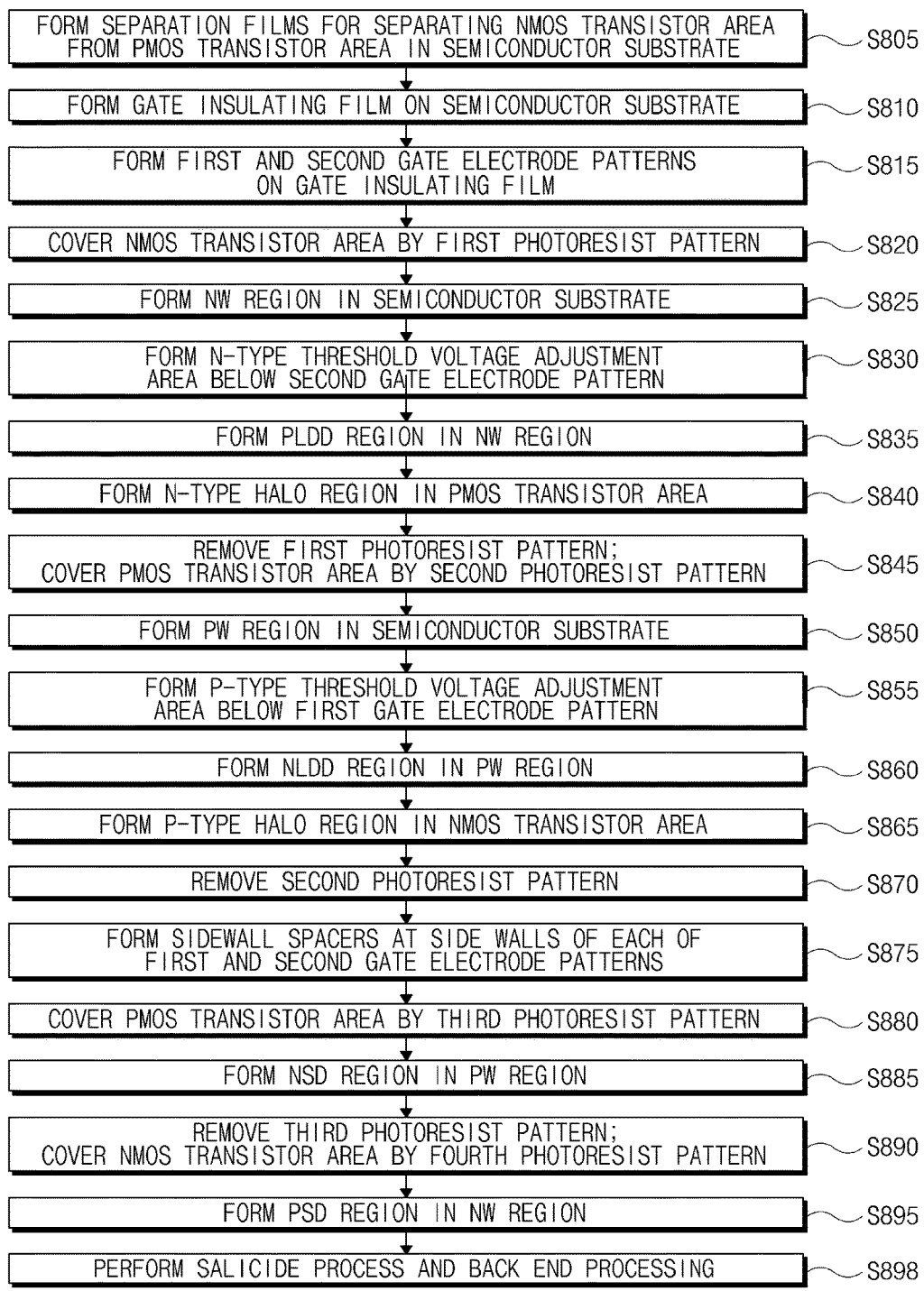
FIG. 8 is a flowchart illustrating a method of forming a complementary metal-oxide-semiconductor (CMOS) transistor, according to an embodiment.

FIG. 8 is a flowchart illustrating a method of forming a complementary metal-oxide-semiconductor (CMOS) transistor, according to an embodiment.

The method of forming the CMOS transistor begins in operation S805 in which the separation films 112 for separating the NMOS transistor area from the PMOS transistor area are formed in the semiconductor substrate 100. In operation S810, the gate insulating film 215 is formed on the semiconductor substrate 100. In operation S815, the conductive film is formed on the gate insulating film 215 and the conductive film is patterned to form the first and second gate electrode patterns 217 and 218.

In operation S820, the NMOS transistor area is covered by the first photoresist pattern 314. In operation S825, an ion injection process is performed into the semiconductor substrate 100 for forming the NW region 325 in the semiconductor substrate 100. Ion injection is performed through the gate insulating film 215 and the second gate electrode pattern 218. In operation S830, the PMOS threshold voltage adjustment area 335 is formed below the second gate electrode pattern 218. In operation S835, the PLDD region 327 is formed in the NW region 325. The n-type Halo region 336 may be formed in the PMOS transistor area in operation S840.

In operation S845, the first photoresist pattern 314 is removed, and the PMOS transistor area is covered by the second photoresist pattern 414. In operation S850, an ion injection process is performed into the semiconductor substrate 100 to form the PW region 425 in the semiconductor substrate 100. Ion injection is performed through the gate insulating film 215 and the first gate electrode pattern 217. In operation S855, the NMOS threshold voltage adjustment area 435 is formed below the first gate electrode pattern 217. In operation S860, the NLDD region 427 is formed in the PW region 425. The p-type Halo region 436 may be formed in the NMOS transistor area in operation S865.

In operation S870, the second photoresist pattern 414 is removed. In operation 875, the sidewall spacers 535 are formed at the side walls of each of the first and second gate electrode patterns 217 and 218. In operation S880, the PMOS transistor area is covered by the third photoresist pattern 614. In operation S885, the NSD region 657 is formed in the p-type well region 425. In operation S890, the third photoresist pattern 614 is removed, and the NMOS transistor area is covered by the fourth photoresist pattern 714. In operation S895, the PSD region 757 is formed in the n-type well region 325. In operation S898, back end processing such as a salicide process, contact formation, metal layer formation, and pad formation is performed to complete the CMOS transistor fabrication process.

Figure 9:
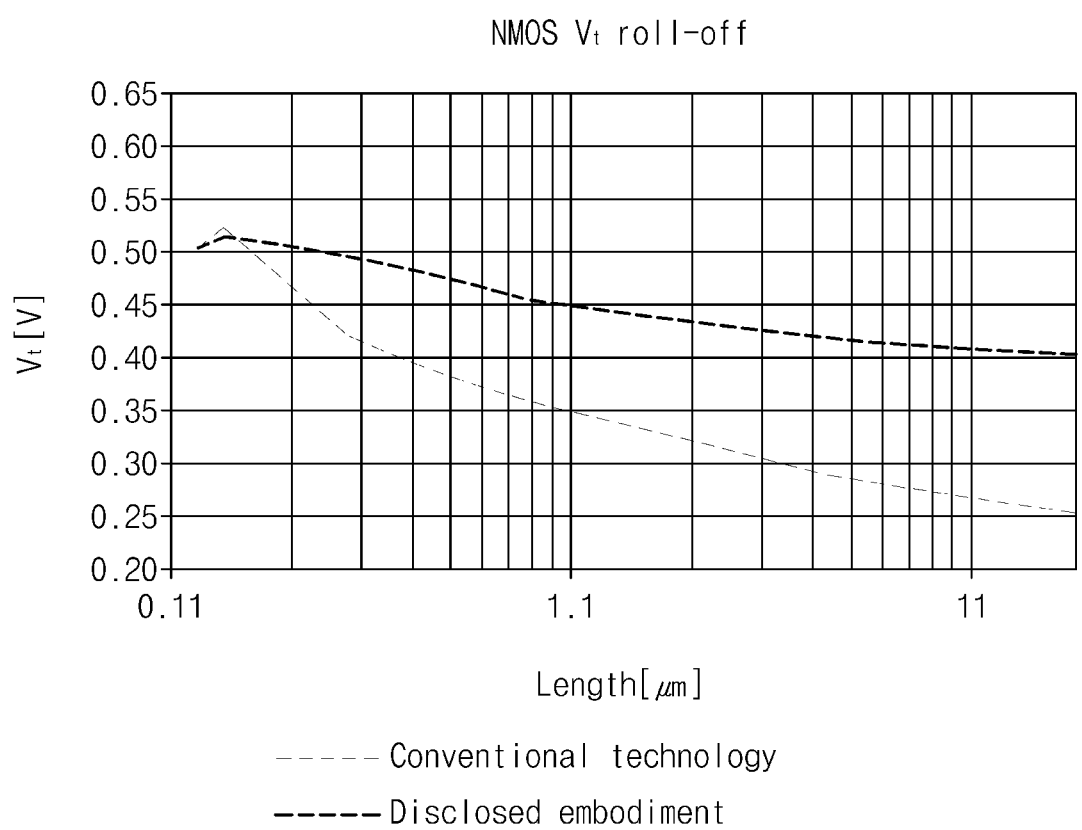
FIG. 9 is a graph illustrating experimental results of roll-off characteristics of threshold voltages along a longitudinal direction of NMOS transistors in a CMOS transistor formed by a method according to an embodiment, and in a CMOS transistor formed by a conventional method.

FIG. 9 is a graph illustrating experimental results of roll-off characteristics of threshold voltages along the longitudinal direction of the NMOS transistors in a CMOS transistor formed using the method according to an embodiment disclosed herein, and in a CMOS transistor formed according to a conventional technology. FIG. 10 is a graph illustrating experimental results of roll-off characteristics of threshold voltages along the longitudinal direction of the PMOS transistors in a CMOS transistor formed using the method according to an embodiment disclosed herein, and in a CMOS transistor formed according to a conventional technology. Referring to FIGS. 9 and 10, it can be appreciated that, in the CMOS transistor formed using a method according to an embodiment disclosed herein, a fluctuation in threshold voltage along the longitudinal direction of the NMOS transistor and a fluctuation in threshold voltage along the longitudinal direction of the PMOS transistor are significantly reduced in comparison to a CMOS transistor formed according to a conventional technology. Consequently, with the method of manufacturing a CMOS transistor according to an embodiment disclosed herein, the characteristics of a CMOS transistor can be considerably improved in comparison to a conventional technology.

According to embodiments disclosed herein, it is possible to simplify a CMOS transistor manufacturing process, reduce the manufacturing costs, and shorten the manufacturing period. For example, according to the disclosed embodiments, it is possible to manufacture a CMOS transistor using a smaller number of masks compared to a conventional CMOS manufacturing process.

In the embodiments disclosed herein, the arrangement of the illustrated components may vary depending on an environment or requirements to be implemented. For example, some of the components may be omitted or several components may be integrated and carried out together. In addition, the arrangement order of some of the components can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method to manufacture a complementary metal-oxide-semiconductor (CMOS) transistor, comprising:
    forming a gate insulating film on a semiconductor substrate;
    forming a first gate electrode pattern on the gate insulating film in an n-type metal-oxide-semiconductor (NMOS) transistor area;
    forming a second gate electrode pattern on the gate insulating film in a p-type metal-oxide-semiconductor (PMOS) transistor area;
    forming a first photoresist pattern covering the NMOS transistor area to expose the second gate electrode pattern in the PMOS transistor area;
    performing a first ion injection process into the PMOS transistor area to form an n-type well region and a p-type lightly doped drain (LDD) region in the PMOS transistor area using the first photoresist pattern, wherein the performing of the first ion injection process comprises performing ion injection through the exposed second gate electrode pattern in the PMOS transistor area;
    removing the first photoresist pattern;
    forming a second photoresist pattern covering the PMOS transistor area to expose the first gate electrode pattern in the NMOS transistor area;
    performing a second ion injection process into the NMOS transistor area to form a p-type well region and an n-type LDD region in the NMOS transistor area using the second photoresist pattern, wherein the performing of the second ion injection process comprises performing ion injection through the exposed first gate electrode pattern in the NMOS transistor area;
    removing the second photoresist pattern; and
    forming sidewall spacers at sidewalls of the first and second gate electrode patterns.

2. The method of claim 1, further comprising forming separation films before the forming of the gate insulating film.

3. The method of claim 2, wherein the performing of the first ion injection process further comprises:
    performing ion injection such that the n-type well region is formed deeper than the separation films, and such that a depth of the n-type well region below the second gate electrode pattern is shallower than a depth of the n-type well region below the separation films.

4. The method of claim 2, wherein the performing of the second ion injection process further comprises:

performing ion injection such that the p-type well region is formed deeper than the separation films, and such that a depth of the p-type well region below the first gate electrode pattern is shallower than a depth of the p-type well region below the separation films.

5. The method of claim 1, wherein the performing of the first ion injection process further comprises either one or both of:
performing an n-type ion injection process to form an n-type threshold voltage adjustment area below the second gate electrode pattern in the PMOS transistor area; and
performing an n-type ion injection process to form an n-type Halo region in the PMOS transistor area.

6. The method of claim 1, wherein the performing of the second ion injection process further comprises either one or both of:
performing a p-type ion injection process to form a p-type threshold voltage adjustment area below the first gate electrode pattern in the NMOS transistor area; and
performing a p-type ion injection process to form a p-type Halo region in the NMOS transistor area.

7. The method of claim 1, further comprising:
forming a third photoresist pattern covering the PMOS transistor area; and
performing a high concentration n-type ion injection process into the NMOS transistor area to form an n-type source region and an n-type drain region.

8. The method of claim 7, further comprising:
removing the third photoresist pattern;
forming a fourth photoresist pattern covering the NMOS transistor area; and
performing a high concentration p-type ion injection process into the PMOS transistor area to form a p-type source region and a p-type drain region.

9. A method to manufacture a complementary metal-oxide-semiconductor (CMOS) transistor, comprising:
forming a gate insulating film on a semiconductor substrate;
forming a first gate electrode pattern on the gate insulating film in an n-type metal-oxide-semiconductor (NMOS) transistor area;
forming a second gate electrode pattern on the gate insulating film in a p-type metal-oxide-semiconductor (PMOS) transistor area;
forming a first photoresist pattern covering the first gate electrode pattern and portions of the semiconductor substrate that are exposed on sides of the first gate electrode pattern;
performing a first ion injection process into the PMOS transistor area to form an n-type well region and a p-type lightly doped drain (LDD) region using the first photoresist pattern, wherein the performing of the first ion injection process comprises performing ion injection through the second gate electrode pattern;
removing the first photoresist pattern;
forming a second photoresist pattern covering the second gate electrode pattern and portions of the semiconductor substrate exposed on sides of the second gate electrode pattern;
performing a second ion injection process into the NMOS transistor area to form a p-type well region and an n-type LDD region using the second photoresist pattern, wherein the performing of the second ion injection process comprises performing ion injection through the first gate electrode pattern; and
removing the second photoresist pattern.

10. The method of claim 9, wherein the performing of the first ion injection process further comprises:
forming an n-type threshold voltage adjustment area in an upper portion of the n-type well region, at a surface of the semiconductor substrate below the gate insulating film.

11. The method of claim 9, wherein the performing of the second ion injection process further comprises:
forming a p-type threshold voltage adjustment area in an upper portion of the p-type well region, at a surface of the semiconductor substrate below the gate insulating film.

12. The method of claim 9, further comprising:
forming separation films in the semiconductor substrate before the forming of the gate insulating film,
wherein the performing of the first ion injection process further comprises performing ion injection such that the n-type well region is formed deeper than the separation films, and such that a depth of the n-type well region below the second gate electrode pattern is shallower than a depth of the n-type well region below the separation films, and
wherein the performing of the second injection process further comprises performing ion injection such that the p-type well region is formed deeper than the separation films, and such that a depth of the p-type well region below the first gate electrode pattern is shallower than a depth of the p-type well region below the separation films.

* * * * *